United States Patent
Thomas

(10) Patent No.: US 9,197,235 B2
(45) Date of Patent: Nov. 24, 2015

(54) SUPPRESSING DIELECTRIC ABSORPTION EFFECTS IN SAMPLE-AND-HOLD SYSTEMS

(71) Applicant: LINEAR TECHNOLOGY CORPORATION, Milpitas, CA (US)

(72) Inventor: Andrew Joseph Thomas, Arlington, MA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/472,160

(22) Filed: Aug. 28, 2014

(65) Prior Publication Data
US 2015/0295588 A1 Oct. 15, 2015

Related U.S. Application Data

(60) Provisional application No. 61/979,139, filed on Apr. 14, 2014.

(51) Int. Cl.
H03M 1/00 (2006.01)
H03M 1/12 (2006.01)
H03G 1/00 (2006.01)

(52) U.S. Cl.
CPC ........... *H03M 1/1245* (2013.01); *H03G 1/0088* (2013.01)

(58) Field of Classification Search
CPC ... H04L 25/063; H04L 25/068; H04L 25/061; H03M 1/1245; H03G 1/0088; H01L 28/60
USPC .......... 341/118–122; 375/232, 350, 229, 346, 375/285; 327/552; 330/129
See application file for complete search history.

(56) References Cited

U.S. PATENT DOCUMENTS

| | | | | |
|---|---|---|---|---|
| 4,023,097 A * | 5/1977 | Hanashey | ............ | G01R 31/316 327/100 |
| 4,211,981 A * | 7/1980 | Lerma | .................... | G06G 7/186 327/341 |
| 5,519,328 A * | 5/1996 | Bennett | .................. | G01R 29/24 324/659 |
| 5,557,242 A * | 9/1996 | Wetherell | ................ | H03L 7/093 327/341 |

(Continued)

FOREIGN PATENT DOCUMENTS

EP 2246985 A1 11/2010

OTHER PUBLICATIONS

The Best of Bob Pease, Understand capacitor soakage to optimize analog systems; National Semiconductor The Sight & Sound of Information; Saved by the Datasheet Archive: Aug. 16, 2002; pp. 1-9.

(Continued)

*Primary Examiner* — Lam T Mai
(74) *Attorney, Agent, or Firm* — McDermott Will & Emery LLP

(57) ABSTRACT

Sample-and-hold (S/H) circuitry operating in track and hold phases and having a first S/H circuit with a first hold capacitor at which a first voltage value is maintained in the hold phase, and a dielectric absorption (DA)-suppressing circuit connectable to the first hold capacitor for operating the S/H circuitry in an additional phase after completing the hold phase and before entering the track phase. The DA-suppressing circuit is configured to supply the first hold capacitor, during an operation in the additional phase, with a second voltage value that is negatively correlated with the first voltage value.

13 Claims, 4 Drawing Sheets

(56) References Cited

U.S. PATENT DOCUMENTS

| | | | | |
|---|---|---|---|---|
| 6,294,945 | B1 * | 9/2001 | Regier | G06G 7/1865 327/336 |
| 7,095,280 | B2 * | 8/2006 | Regier | H03F 3/211 330/258 |
| 2010/0271245 | A1 | 10/2010 | Thomas et al. | |
| 2014/0152279 | A1 * | 6/2014 | Howes | G05F 1/10 323/273 |

OTHER PUBLICATIONS

Extended European Search Report dated Jun. 18, 2015, issued in corresponding European Patent Application No. 15001050.2.

* cited by examiner

SUPPRESSING DIELECTRIC ABSORPTION EFFECTS IN SAMPLE-AND-HOLD SYSTEMS

RELATED APPLICATIONS

This application claims priority of U.S. provisional patent application No. 61/979,139 entitled "REDUCING OR ELIMINATING DIELECTRIC ABSORPTION EFFECTS," filed on Apr. 14, 2014 and incorporated herein by reference

TECHNICAL FIELD

This disclosure relates generally to capacitive sample-and-hold (S/H) systems, and in particular, to reducing or eliminating dielectric absorption effects in the S/H systems.

BACKGROUND ART

Dielectric absorption (DA) is a form of capacitor non-ideality wherein the capacitor has additional memory of its history (beyond its expected capacitance), and tends in the direction of trying to return to a previous value of voltage across it. This memory (also called soakage) is attributed to a charge which becomes trapped in the dielectric of the capacitor over time, and takes time to escape as well. As such, it varies substantially with the physical construction of the capacitor, both among discrete types, and various implementations available in integrated circuits. These charge-trapping mechanisms also often have large temperature dependencies, varying by an order of magnitude or more over typical integrated circuit operating temperature ranges.

In the context of a system integrating a capacitive sample-and-hold (S/H), the DA of the hold capacitor causes the value of a given sample to trend towards the value of previous samples as it is held. A simplified example of such an S/H circuit is shown as circuit 100 in FIG. 1. S/H circuit 100 takes an input voltage at input terminal 120 and produces a sample-and-held output at output terminal 121. Input buffer 110 buffers the input voltage. Hold capacitor 101 is periodically connected to the buffered input by sampling switch 105. Output buffer 115 isolates the hold capacitor 101 from loads applied to the output terminal 121.

The circuit operates in two alternating phases. The first is a track phase during which switch 105 is closed. In the track phase, the input buffer 110 forces the voltage across the hold capacitor 101 to be equal to the input voltage. Output buffer 115 then causes the output voltage 121 to be equal to the hold capacitor voltage and thus the input voltage.

The circuit transitions from a track phase to a hold phase when switch 105 is opened at a sampling moment. In the hold phase, the hold capacitor maintains the approximate voltage present at the sampling moment, and this voltage is presented at the output. If the hold capacitor 101 has DA, the charge trapping mechanism represents storage of charge which retains information about voltages applied to the hold capacitor at times before the sampling moment. As the hold phase progresses, that charge storage will affect the value of voltage on the hold capacitor, which will manifest as a deviation of the output voltage from the intended behavior.

Where the S/H function is part of a sampling analog-to-digital converter (ADC), DA will cause the ADC's output for a given sample to be affected by the values of previous samples. FIG. 2 shows an exemplary ADC circuit 200 that includes voltage input 220 and digital code output 221. An array of switches 207 operates to couple an array of capacitors 201 to the input 220, reference voltage terminal 222, or ground under the control of respective control signals 223 produced by control logic 217. The capacitor array 201 is also coupled to the input of comparator 215, and may be connected to ground by sampling switch 205.

The ADC circuit 200 operates as a successive-approximation (SAR) ADC in two primary phases. The first acquisition phase is analogous to the tracking phase of the circuit 100. In this phase, sampling switch 205 is closed, and switch array 207 is configured to couple the capacitor array 201 to input voltage 220. Thus, the capacitors of array 201 have the input voltage imposed across them.

The circuit transitions from the acquisition phase to the conversion phase (analogous to the hold phase of circuit 100) by opening sampling switch 205 at a sampling moment. Switch array 207 is then operated to connect capacitors 201 to the reference voltage terminal 222 or ground on the basis of the outputs of comparator 215, as determined by control logic 217 in a successive approximation process, ultimately determining the digital output 221.

During this conversion phase, the voltage presented to the comparator is determined by the voltage across the capacitors at the sampling moment and the voltage applied by switches 207. If capacitors 201 have DA, the charge trapping mechanism represents storage of charge which retains information about voltages applied to the capacitors at times before the sampling moment. As the conversion phase progresses, that charge storage will affect the value of voltage on presented to the comparator, which will cause a deviation of the output digital code from the ideal value.

In some applications, this effect may not be deleterious, particularly as DA is typically a fairly linear phenomenon. However, in any situation where the S/H is being multiplexed between channels, the DA causes a low-frequency crosstalk between the channels which may be limiting.

A first known technique for reducing DA is typically present in any S/H design. The effect of DA from one sample upon the following sample is directly dependent upon the ratio of time in which the capacitor holds the input signal to the time in which it tracks the input signal. Thus, one may decrease the sample-to-sample memory by decreasing that ratio (i.e. increasing the track time relative to the hold time). Unfortunately, changing this ratio substantially requires large changes to the timing characteristics, for example slowing down an ADC's sample rate by a factor comparable to the factor of improvement in crosstalk, and in many cases such a timing compromise is unacceptable.

A second known technique for reducing DA provides an analog cancellation term. For example, an explicit network of resistors and capacitors may be exposed to the same voltage stimuli as the hold capacitor. The resistors are chosen to model the long-term storage effects present in the hold capacitor due to DA, and then used to inject a small correction term into the primary signal path.

A conceptually similar third technique may be used when the S/H circuit is part of an ADC. In particular, a digital record of previous conversion outputs can be kept, and used to adjust the digital output of the present conversion in a predetermined fashion.

The second and third techniques suffer from the problem of attempting to cancel the DA effect with an unrelated external term. Given that the DA effect may vary dramatically with temperature, it is at best difficult to construct a term which provides good cancellation across a wide range of temperatures.

Therefore, it would be desirable to develop a DA-suppressing technique that would avoid disadvantages of known techniques.

SUMMARY OF THE DISCLOSURE

In accordance with one aspect of the present disclosure, sample-and-hold (S/H) circuitry operating in track and hold phases comprises a first S/H circuit having a first hold capacitor at which a first voltage value is maintained in the hold phase, and a dielectric absorption (DA)-suppressing circuit connectable to the first hold capacitor for operating the S/H circuitry in an additional phase after completing the hold phase and before entering the track phase.

The DA-suppressing circuit is configured to supply the first hold capacitor, during an operation in the additional phase, with a second voltage value that is negatively correlated with the first voltage value.

In accordance with an exemplary embodiment, the DA-suppressing circuit may include an inverting amplifier having a first input responsive to the first voltage value and an output, and a first switching element for coupling the output of the inverting amplifier to the first holding capacitor after the hold phase so as to operate the S/H circuitry in the additional phase. The inverting amplifier may have a second input supplied with a bias voltage value.

The DA-suppressing circuit may further include a second S/H circuit having an input coupled to an output of the first S/H circuit and an output coupled to the first input of the inverting amplifier.

The second S/H circuit may include a second hold capacitor and a second switching element for coupling the second hold capacitor to the output of the first S/H circuit during the hold phase. The second switching element may be opened before a transition from the hold phase to the additional phase so as the first voltage value at the second holding capacitor. The first switching element may be opened and the second switching element may be closed to switch the S/H circuitry from the additional phase to the track phase.

In accordance with another aspect of the present disclosure, a sampling analog-to-digital converter operating in acquisition and conversion phases comprises an array of capacitors, an array of switches controllable to couple the capacitors of the array to sources of at least two different voltages during the conversion phase, applying a first average voltage value across the capacitors, and a dielectric absorption (DA) suppressing circuit for controlling the array of switches during an additional phase after completing the conversion phase and before entering the acquisition phase.

The DA-suppressing circuit may be configured to control the switches to apply a second average voltage value across the capacitors. The second average voltage value is negatively correlated with the first average voltage value.

The DA-suppressing circuit may have a first input responsive to multiple first control signals produced by the converter, and an output for producing multiple second control signals corresponding to the respective first control signals and supplied to the respective switches of the array to control the switches so as to apply the second average voltage value across the capacitors.

The DA-suppressing circuit may further have a second input supplied with an enable signal asserted at a first logic level during the acquisition and conversion phases, and asserted at a second logic level during the additional phase. The DA-suppressing circuit may be configured to produce the second control signals having values substantially equivalent to values of the respective first control signals when the enable signal is at the first logic level, and to produce the second control signals having values logically inverted with respect to the values of the corresponding first control signals when the enable signal is at the second logic level.

In an exemplary embodiment, the DA-suppressing circuit may include multiple exclusive OR gates having first inputs responsive to the respective first control signals, second inputs responsive to the enable signal, and outputs for producing the respective second control signals.

The DA-suppressing circuit may further include multiple latches having outputs coupled to the first inputs of the respective exclusive OR gates, and having inputs responsive to the respective first control signals.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using the specific examples of S/H circuitry and ADC presented below. However, the concept of the disclosure is applicable to various other modifications of the implementations discussed below.

The present disclosure provides a technique for suppressing DA effects in an S/H system which is inherently self-referential, and may be accomplished with little or no timing overhead. As discussed below, the essence of the disclosed technique is to add a third "countersoak" phase between the hold phase and the track phase of the S/H procedure.

Figure 1:
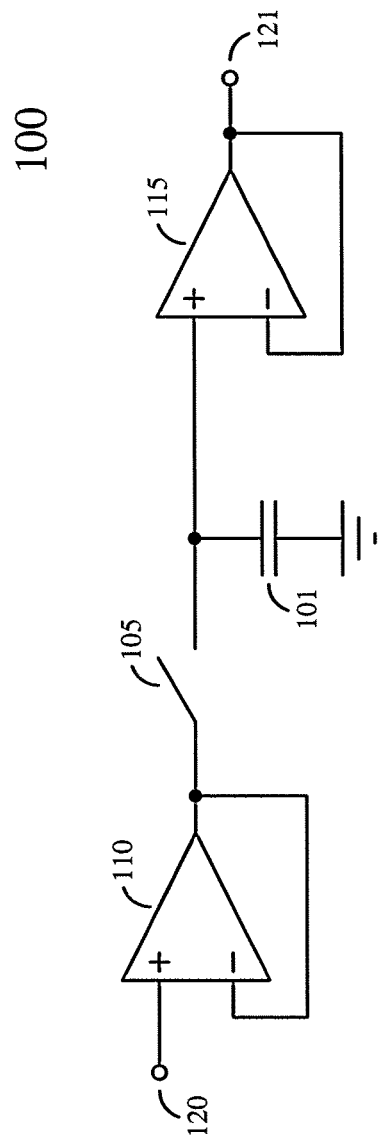
FIG. 1 illustrates a conventional sample-and-hold (S/H) circuit.
Figure 3:
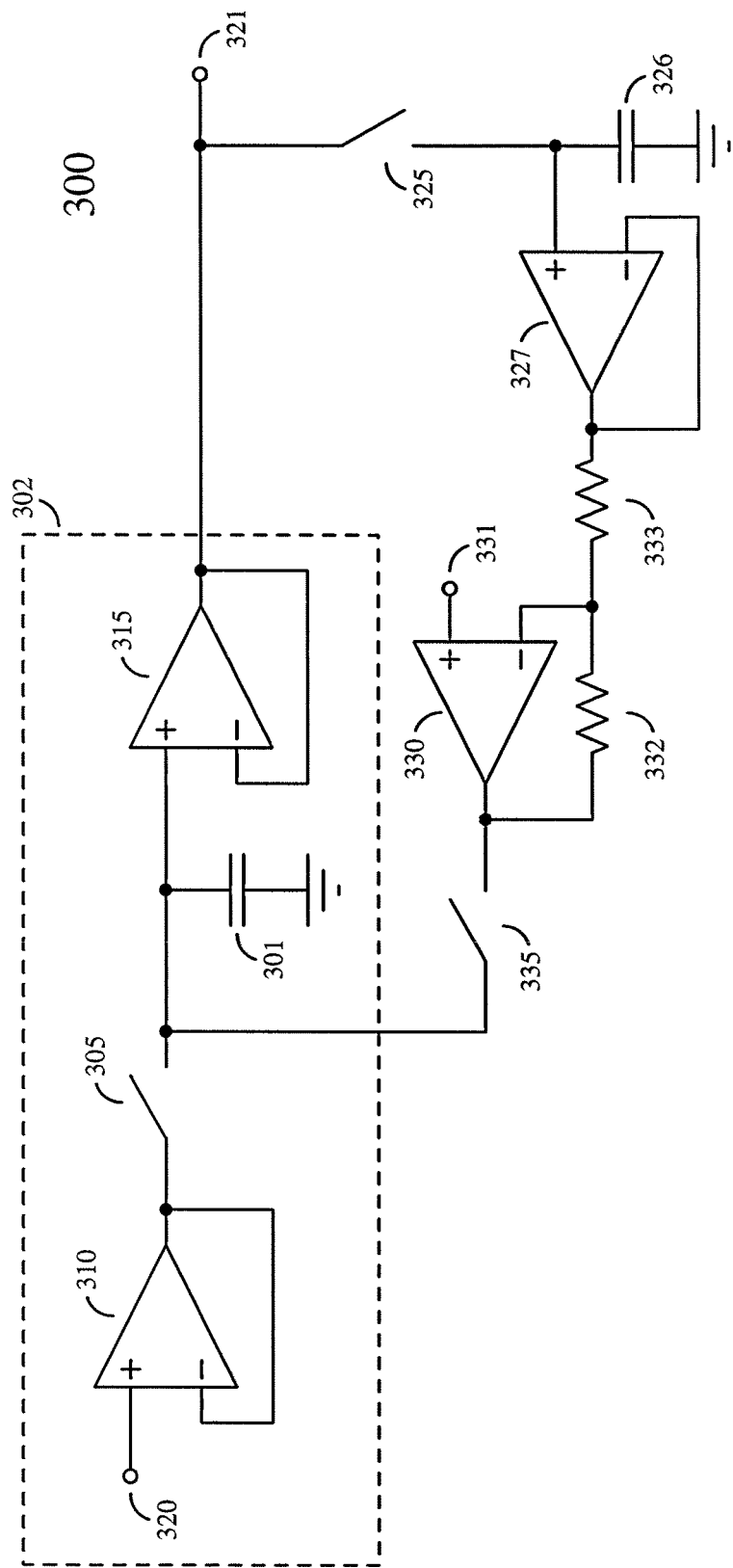
FIG. 3 shows S/H circuitry of the present disclosure.

An exemplary embodiment of S/H circuitry 300 of the present disclosure is presented in FIG. 3. The S/H circuitry 300 contains S/H subcircuit 302 which is substantially similar to the S/H circuit 100 in FIG. 1. In particular, the S/H subcircuit 302 takes an input voltage at input terminal 320 of the S/H circuitry 300 and produces a sample-and-held output at output terminal 321 of the S/H circuitry 300. The S/H subcircuit 302 includes input buffer circuit 310, hold capacitor 301 coupled via sampling switch 305 to the input buffer 310, and output buffer 315. The input buffer 310 may be implemented as an operational amplifier having a non-inverting input coupled to an input terminal 320 of the S/H circuitry 300, and an output coupled to an inverting input. The output buffer 315 may be implemented as an operational amplifier having a non-inverting input coupled to the hold capacitor 301, and an output coupled to an inverting input and to the output terminal 321 of the S/H circuitry 300.

The S/H circuitry 300 further incorporates a DA suppression circuit for suppressing DA of the hold capacitor 301. The DA suppression circuit includes an inverting operational amplifier 330 having an output connectable to the hold capacitor 301 via switch 335. An inverting input of the amplifier 330 is coupled via resistor 332 to the output of the amplifier 330, and is supplied with an output signal of a secondary S/H circuit including switch 325, hold capacitor 326, and output buffer 327.

The switch 325 connects the hold capacitor 326 to the output terminal 321 of the S/H circuitry. The output buffer 327 may be implemented as an operational amplifier having an output coupled via resistor 333 to the inverting input of the amplifier 330. A non-inverting input of the buffer 327 is connectable to the output terminal 321 via the switch 325. An inverting input of the buffer 327 is connected to the output of the buffer 327. A non-inverting input of the inverting amplifier 330 may be supplied by a bias voltage from bias voltage terminal 331.

The S/H circuitry 300 operates in track and hold phases of an S/H procedure using the S/H subcircuit 302. In particular, when switch 305 is closed, the S/H circuitry 300 operates in the track phase, in which the input buffer 310 forces the voltage across the hold capacitor 301 to be equal to the input voltage at the input terminal 320. The output buffer 315 then causes the output voltage at the output terminal 321 to be equal to the hold capacitor voltage and thus the input voltage.

In the hold phase, when the switch 305 is open, the hold capacitor 301 maintains the approximate voltage present at the sampling moment, and this voltage is provided at the output terminal 321. As discussed above, if the hold capacitor 301 has DA, the charge trapping mechanism represents storage of charge which retains information about voltages applied to the hold capacitor 301 at times before the sampling moment. As the hold phase progresses, that charge storage will affect the value of voltage on the hold capacitor, which will manifest as a deviation of the output voltage from the intended behavior.

During the hold phase of the S/H circuitry 300, the switch 335 is open and the switch 325 is closed, applying the output voltage 321 to the capacitor 326, which is buffered by the buffer 327. Before the end of the hold phase, the switch 325 is opened, storing the voltage on the capacitor 326. The amplifier 330, in conjunction with resistors 332 and 333, provides a voltage at its output which is negatively correlated with the voltage on the capacitor 326, optionally modified by the bias voltage supplied from the terminal 331.

The S/H circuitry 300 then transitions from the hold phase to the countersoak phase by closing switch 335, thereby applying a voltage value across capacitor 301 which is negatively correlated with the voltage held by the capacitor 301 in the hold phase. In the countersoak phase, the output voltage 321 is no longer equal to the value held by the capacitor 301 in the hold phase or to the input value at the input terminal 320. In applications where this is not acceptable, additional circuitry may be used, for example, to switch the input of buffer 315 to the input terminal 320.

At the conclusion of the countersoak phase, the switch 335 is opened and the switch 305 is closed, switching the S/H circuitry 300 to the track phase described above in conjunction with circuit 100. In the track phase, the input buffer 310 forces the voltage across the hold capacitor 301 to be equal to the voltage at the input terminal 320. The voltage at the output terminal 321 also becomes equal to the voltage at the input terminal 320.

The effect of the countersoak phase is to quickly modify the charge corresponding to the DA of capacitor 301, to cause a counteracting short-timescale movement during the subsequent hold phase. Timing of the countersoak phase may be chosen relative to the lengths of the track and hold phases, as well as the ratio of resistors 332 and 333, to substantially eliminate the DA effect at the output 321.

As described, the addition of the countersoak phase to the system operation implies an overall change to the system timing. This modification may be of much smaller magnitude than is necessary to achieve a given improvement under the first known technique described above, since the short time-timescale DA effects will be dominated by the most recent stimulus. This advantage may be increased by choosing resistors 322 and 323 so as to provide a larger voltage across the capacitor 301 in the countersoak phase.

Unlike the dissimilar cancellation terms produced by known techniques, the system of the present disclosure produces a cancellation term using the DA effect itself. This means that the required timings may be chosen without knowledge of the magnitude of the DA effect. More importantly, since the timings required for cancellation are substantially independent of the magnitude of DA effect, the cancellation is effective at all temperatures.

A voltage value $V_2$ supplied to the hold capacitor in the countersoak phase may be negatively correlated with the voltage value $V_1$ held in the hold capacitor in the hold phase.

In the limited case where the DA suppression circuit produces the voltage $V_2$ deterministically from the voltage $V_1$, and the voltage $V_1$ is known or assumed to take on any value between a lower bound $\alpha$ and an upper bound b with equal probability, then $V_2$ (as a function of $V_1$) may obey the relationship $$\int_a^b v_1 v_2 dv_1 < \frac{a+b}{2}\int_a^b v_2 dv_1.$$

In a more general case, the voltage value $V_1$ may have a non-uniform distribution having mean $\mu_1$, and the DA-suppressing circuit may form a process producing the voltage value $V_2$ in a non-deterministic fashion such that it has a mean $\mu_2$. In such a case, the process should be such that the joint probability distribution of the first and second voltage $P_{12}(V_1, V_2)$ may obey the relationship $\iint_{-\infty}^{\infty} v_1 v_2 P_{12}(v_1, v_2) dv_1 dv_2 < \mu_1 \mu_2$.

In an example of the S/H circuitry 300, the voltage value applied to the capacitor 301 in the countersoak phase may be simply proportional to the opposite polarity of the voltage value held by the capacitor 301 in the hold phase. For example, if a +4V value is held by the capacitor 301 in the hold phase, the capacitor 301 may be supplied with the voltage of −4V in the countersoak phase. This simple choice obeys the equations above substantially independent of the distribution of input voltages. However other choices can give further improvements. For example, while the simple scheme may have timings chosen to provide perfect cancellation of the memory from one held value to the next, there will remain a much smaller effect from the other previously held values. This secondary effect may be cancelled by the addition of a secondary S/H circuit which allows application of a voltage which is the opposite of the previous sample plus a smaller amount of the opposite of the sample before that.

Similarly, if the DA effect shows a non-linearity or temperature dependence after cancellation, that effect may be accounted for by introducing a counteracting dependence in the voltage applied during the countersoak phase, for example, by replacing resistor 322 or 323 with a component having appropriate temperature dependence or non-linearity.

Also apparent is that any additional time which must be added for the countersoak phase is much more effective at reducing DA than simply increasing cycle time by adding track time. In some cases, the length of time between hold phases is determined by factors other than necessary analog settling time in the track phase, for example time needed to switch channels. Moreover, there will frequently already be a third period of resetting the hold capacitor between samples. In these cases, the addition of a countersoak period may not increase cycle times at all.

Figure 2:
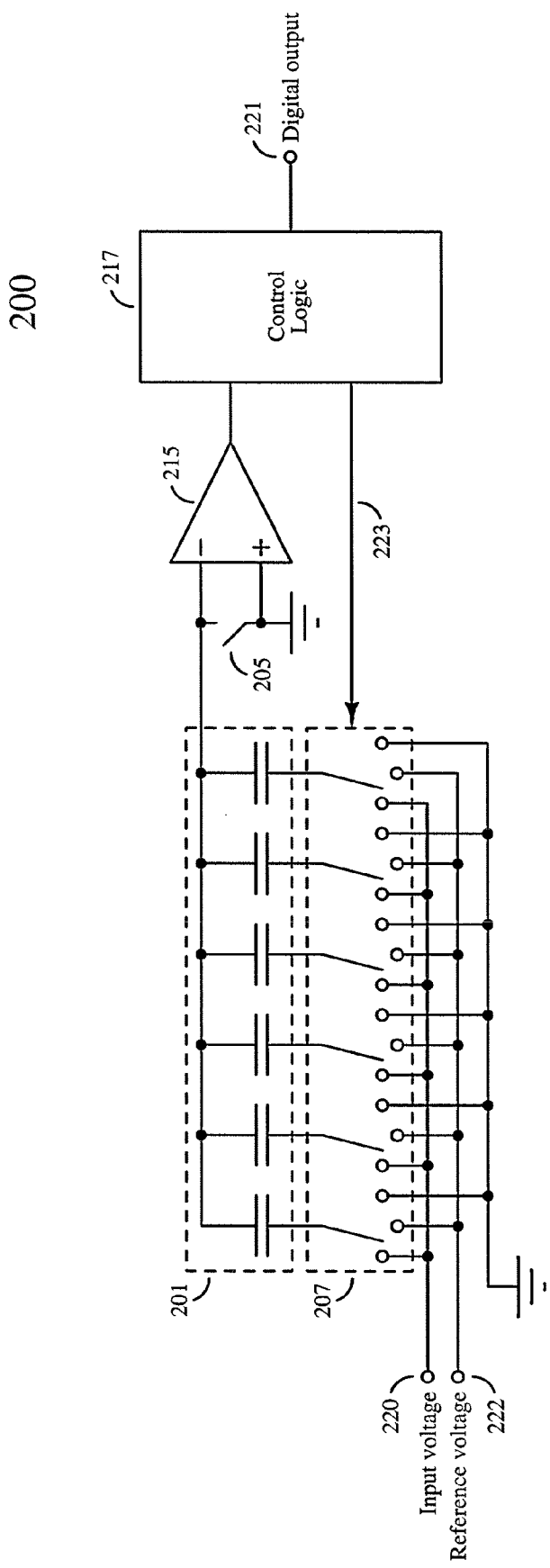
FIG. 2 illustrates a conventional sampling analog-to-digital converter (ADC).
Figure 4:
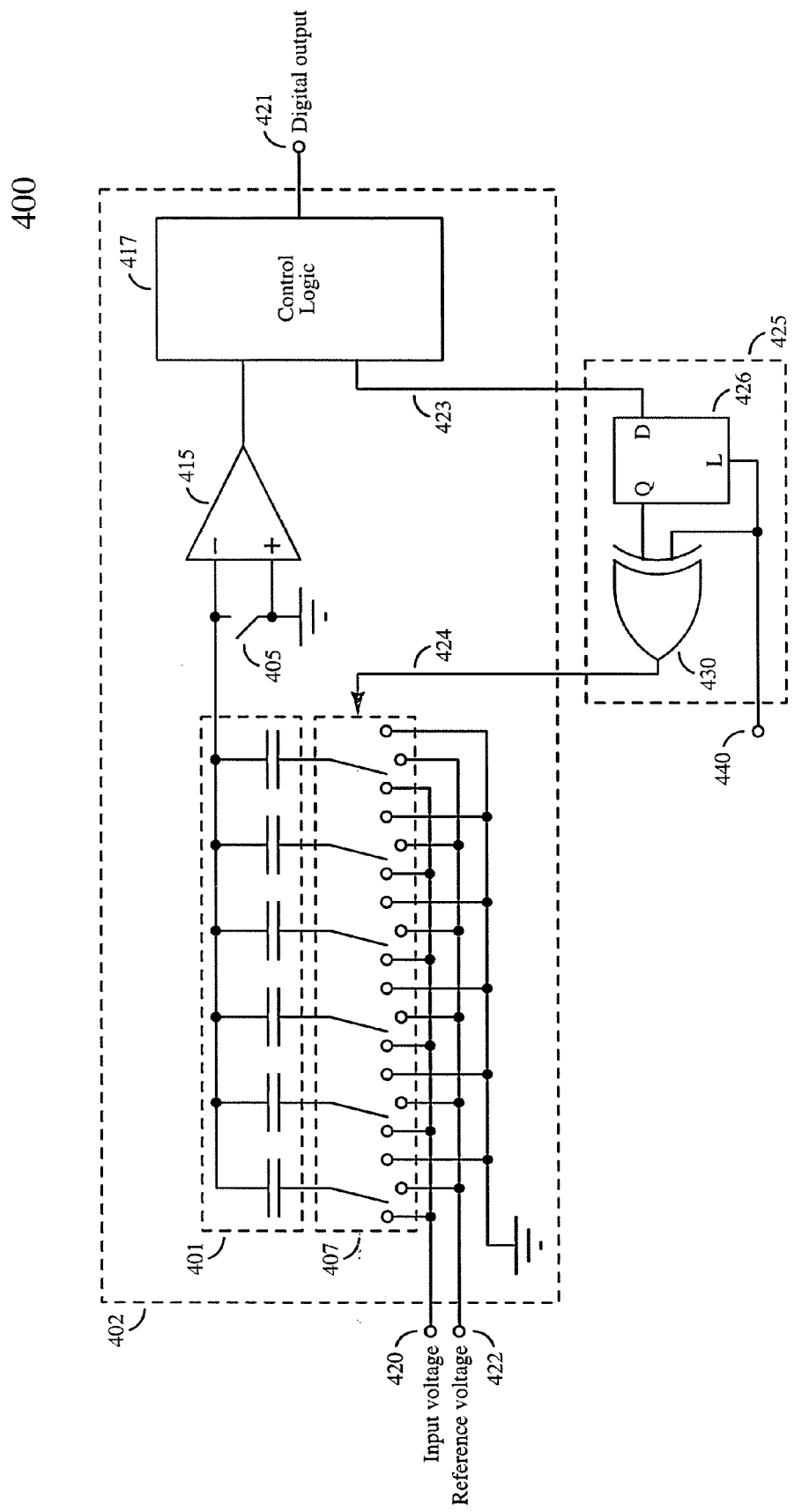
FIG. 4 shows a sampling ADC of the present disclosure.

FIG. 4 illustrates ADC circuit 400 operating with an added countersoak phase described above. The ADC circuit 400 is responsive to an analog input signal at input terminal 420 to produce an output digital signal at output terminal 421, and comprises ADC subcircuit 402 which contains the same elements with like numbering as the ADC circuit 200 of FIG. 2. However, the control signal is modified with respect to the control signals 223 in FIG. 2.

In particular, the ADC subcircuit 402 includes array 401 of capacitors, and array 407 of switches corresponding to the capacitors 401. Also, the ADC subcircuit 402 includes comparator 415 and control logic 417.

Each switch in the array 407 is controllable by a respective control signal 424 to couple first terminal of the respective capacitor 401 to the input terminal 420, reference voltage terminal 422, or ground terminal. Second terminals of the capacitors 401 are coupled to the input of comparator 415, and may be connected to ground by sampling switch 405. The output of the comparator 415 is coupled to the control logic 417 that produces the digital output signal at output terminal 421.

Further, the ADC circuit 400 comprises DA-suppressing subcircuit 425 that operates to modify a plurality of control signals 423 produced by the control logic 417 so as to form a plurality of respective control signals 424 that control the respective switches 407. The DA-suppressing subcircuit 425 includes a plurality of transparent latches 426 and a plurality of exclusive-OR gates 430. To maintain the clarity of the drawing, FIG. 4 shows a single latch 426 and a single exclusive-OR gate 430. However, the number of the latches 426 and the number of the gates 430 in the subcircuit 425 corresponds to the number of switches 407 controlled by the respective control signals 424.

Each transparent latch 426 has a latch-enable input L supplied by countersoak control signal 440, and a data input D supplied by the respective control signal 423 formed by the control logic 417. The countersoak control signal may be formed by the control logic 417 or by a separate control unit. An output Q of each latch 426 is coupled to a first input of the respective exclusive-OR gate 430, a second input of which is supplied with the countersoak control signal 440.

The ADC circuit 400 operates in three phases. The first phase is an acquisition phase equivalent to the acquisition phase of the ADC circuit 200. In this phase, the sampling switch 405 is closed, and the switches 407 are configured to couple the respective capacitors 401 to the input terminal 420. During the acquisition phase, the countersoak control signal 440 is at a logic low level, placing the transparent latches 426 in a transparent state, and thereby making the control signals 424 substantially equivalent to the respective control signals 423.

The second phase is a conversion phase equivalent to the conversion phase of the ADC circuit 200. In this phase, the sampling switch 405 is open, and the switches 407 are controlled to connect the respective capacitors 401 to the reference voltage terminal 422 or to the ground terminal on the basis of the outputs of comparator 415, as determined by the control logic 417 in a successive-approximation process, ultimately determining the digital output signal at the terminal 421. During the conversion phase, the countersoak control signal 440 remains at a logic low level, placing the transparent latches 426 in a transparent state, and thereby making the control signals 424 substantially equivalent to the respective control signals 423.

Following the completion of the conversion phase, the ADC circuit 400 transitions to the countersoak phase. In this phase, the sampling switch 405 is closed, connecting capacitors 401 to the ground terminal. The countersoak control signal 440 is set to a logic high level, causing each transparent latch 426 to hold the value of the respective control signal 423 which was determined at the end of the conversion phase. The exclusive-OR gates 430 then act to logically invert the held value, causing each control signal 424 to correspond to the digital complement of the value present at the end of the conversion phase. This applies an average voltage value across the capacitors 401 which is negatively correlated with the average voltage value across the capacitors during the conversion phase. After the countersoak phase, the switches 407 may be controlled to charge the respective capacitors 401 to a fixed state before coupling them to the input terminal 420 for the subsequent acquisition phase.

As described in conjunction with the circuit 300, this operation of circuit 400 may produce complete cancellation with appropriate choice of timings, and require little to no additional cycle time. Also as in the circuit 300, the cancellation produced is effective substantially independent of the magnitude of DA effect, and therefore independent of temperature.

This operation of the ADC circuit 400 may also attain the further improvements described in conjunction with circuit 300 by increasing the digital complexity of subcircuit 425. For example, additional memory elements such as latches or flip-flops may be employed to allow compensation for previous conversions.

If the control signals 423 are interpreted as a digital value, the exclusive-OR gates 430 provide the simple arithmetic function of complement, independently of the representation employed. With appropriate consideration of the representation, further digital arithmetic such as adders and multipliers or transformations such as look-up tables may be employed to include additional compensation sources or correct for non-linearities by adjusting the value of the control signals 424.

While the ADC circuit 400 shows the application of the invention to the specific sampling ADC shown as the ADC subcircuit 402, similar improvements may be achieved by equivalent modifications to the switch control signals of other sampling ADCs having other configurations of capacitors and switches, or operating by techniques other than successive approximation. While the subcircuit 402 has a particular sampling ADC structure which is of the SAR type, operating on a single-ended input in a specific range, with a specific configuration of capacitors and switches, substantially the same effect occurs in other implementations. For example, the comparator 415 might be replaced by a multi-level single step ADC and residue amplifier in a pipelined converter, or the capacitor array 401 might be functionally separated into an input sampling capacitor and a digital-to-analog conversion section, and the like.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. Sample-and-hold (S/H) circuitry operating in track and hold phases, and comprising:
    a first S/H circuit having a first hold capacitor at which a first voltage value is maintained in the hold phase, and
    a dielectric absorption (DA)-suppressing circuit connectable to the first hold capacitor for operating the S/H circuitry in an additional phase after completing the hold phase and before entering the track phase,
    the DA-suppressing circuit being configured to supply the first hold capacitor, during an operation in the additional phase, with a second voltage value which is negatively correlated with the first voltage value.

2. The S/H circuitry of claim 1, wherein the DA-suppressing circuit includes:
    an inverting amplifier having a first input responsive to the first voltage value and an output, and
    a first switching element for coupling the output of the inverting amplifier to the first holding capacitor after the hold phase so as to operate the S/H circuitry in the additional phase.

3. The S/H circuitry of claim 2, wherein the inverting amplifier has a second input supplied with a bias voltage value.

4. The S/H circuitry of claim 3, wherein the DA-suppressing circuit further includes a second S/H circuit having an input coupled to an output of the first S/H circuit and an output coupled to the first input of the inverting amplifier.

5. The S/H circuitry of claim 4, wherein the second S/H circuit includes a second hold capacitor and a second switching element for coupling the second hold capacitor to the output of the first S/H circuit during the hold phase.

6. The S/H circuitry of claim 5, wherein the second switching element is opened before a transition from the hold phase to the additional phase so as maintain the first voltage value at the second holding capacitor.

7. The S/H circuitry of claim 6, wherein the first switching element is opened and the second switching element is closed to switch the S/H circuitry from the additional phase to the track phase.

8. A sampling analog-to-digital converter operating in acquisition and conversion phases and comprising:
    an array of capacitors,
    an array of switches controllable to couple the capacitors of the array to sources of at least two different voltages during the conversion phase, applying a first average voltage value across the capacitors, and
    a dielectric absorbtion (DA)-suppressing circuit for controlling the array of switches during an additional phase after completing the conversion phase and before entering the acquisition phase,
    the DA-suppressing circuit being configured to control the switches to apply a second average voltage value across the capacitors, the second average voltage value being negatively correlated with the first average voltage value.

9. The converter of claim 8, wherein the DA-suppressing circuit has a first input responsive to multiple first control signals produced by the converter, and an output for producing multiple second control signals corresponding to the respective first control signals and supplied to the respective switches of the array to control the switches so as to apply the second average voltage value across the capacitors.

10. The converter of claim 9, wherein the DA-suppressing circuit further has a second input supplied with an enable signal asserted at a first logic level during the acquisition and conversion phases, and asserted at a second logic level during the additional phase.

11. The converter of claim 10, wherein the DA-suppressing circuit is configured to produce the second control signals having values substantially equivalent to values of the respective first control signals when the enable signal is at the first logic level, and to produce the second control signals having values logically inverted with respect to the values of the corresponding first control signals when the enable signal is at the second logic level.

12. The converter of claim 11, wherein the DA-suppressing circuit further includes multiple latches having inputs responsive to the respective first control signals.

13. The converter of claim 12, wherein the DA-suppressing circuit includes multiple exclusive OR gates having first inputs coupled to the outputs of the respective latches, second inputs responsive to the enable signal, and outputs for producing the respective second control signals.

\* \* \* \* \*